United States Patent
Palanisamy et al.

(10) Patent No.: US 6,512,301 B1
(45) Date of Patent: Jan. 28, 2003

(54) MAKING INTERCONNECTIONS TO A NON-FLAT SURFACE

(75) Inventors: Ponnusamy Palanisamy, Lansdale, PA (US); James R. Demarco, Howell, NJ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/904,238

(22) Filed: Jul. 12, 2001

(51) Int. Cl.⁷ .......................... H01L 23/48; H01L 23/52; H01L 29/40
(52) U.S. Cl. ......................................... 257/777; 257/82
(58) Field of Search .......................... 257/82, 431, 414, 257/461, 734, 735, 736, 737, 738, 113, 777, 781

(56) References Cited

U.S. PATENT DOCUMENTS

| | | | | |
|---|---|---|---|---|
| 5,686,790 A | * | 11/1997 | Curtin et al. | 313/493 |
| 6,088,236 A | * | 7/2000 | Tomura et al. | 361/783 |
| 6,184,567 B1 | * | 2/2001 | Fujisawa et al. | 257/532 |
| 6,294,822 B1 | * | 9/2001 | Nakata | 257/461 |

* cited by examiner

Primary Examiner—David Nelms
Assistant Examiner—David Nhu
(74) Attorney, Agent, or Firm—Trop, Pruner & Hu, P.C.

(57) ABSTRACT

A non-planar surface may be surface mounted to another surface using solder balls that may be modified to generate a planar surface for receiving the second surface. In one embodiment, the solder balls may be secured to an irregular surface and then scrapped to form a planar contacting surface. A second surface to be bonded to the first surface may then be attached to the planar contacting surface and the solder balls reflowed to create a surface mount.

5 Claims, 2 Drawing Sheets

MAKING INTERCONNECTIONS TO A NON-FLAT SURFACE

BACKGROUND

This invention relates generally to the fabrication of electronic devices and particularly to techniques for electrically interconnecting two surfaces.

Surface mount technology involves using heat activated interconnects, normally called solder balls or bumps, that are positioned between two surfaces to be joined. For example, an integrated circuit may have an array of contacts on one surface that need to be connected to an array of contacts on a printed circuit board.

Solder balls or bumps are globules of solder that may be deposited on the contacts of surfaces to be joined. They are generally deposited at a temperature so that they slightly melt and adhere to the point where they are placed. The solder balls are placed on the contacts of one surface to be joined. Then the other surface is aligned over the solder balls, and the two surfaces may be joined merely by the application of heat.

Thus, surface mount technology enables two surfaces to be electrically connected in a very convenient way. A number of integrated circuits may be attached to the same printed circuit board all at the same time using the same heat step called a reflow step.

Generally, the two surfaces to be bonded may be relatively flat but need not be perfectly flat. When a typical solder bumped flip-chip is attached to a circuit board by reflowing the solder, the solder bumps collapse or flatten to some degree, as a result of wetting of the solder to the bonding pad of the circuit board. This collapse may accommodate some variation in the bump height and good electrical connections can be made even with variations in bump height of about 1 mil, the normal height being 4 mils. Thus, flip-chip bump suppliers routinely supply bumped devices that meet this requirement of bump height tolerance.

However, when one of the surfaces to be bump bonded has a curvature or non-planarity that exceeds the bump height tolerance, the possibility exists that ineffective electrical connections may be made between the surfaces. In one instance, some bumps may not actually reach both surfaces, creating an open. In other cases, the bumps may be too deformed by a surface irregularity, causing the bumps to squeeze outwardly and to make contact with adjacent bumps or adjacent electrical structures. This may result in shorts.

Thus, there is a need for a way to handle non-planarity that exceeds bump tolerances in bump bonding applications.

DETAILED DESCRIPTION

Figure 1:
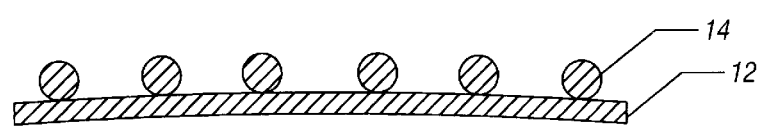
FIG. 1 is an enlarged cross-sectional view of one embodiment in accordance with the present invention.
Figure 2:
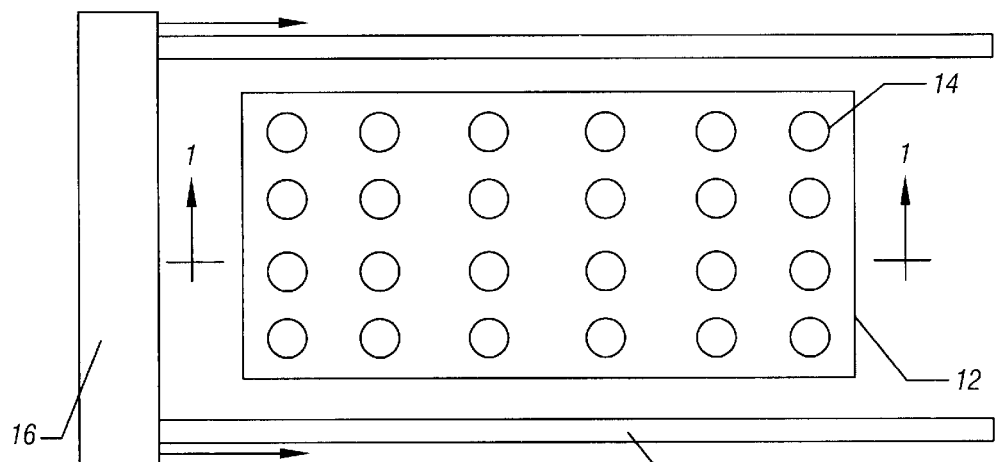
FIG. 2 is a top plan view corresponding to FIG. 1 in accordance with one embodiment of the present invention.

Referring to FIG. 1, a surface 12 to be surface mounted may have a plurality of solder bumps or balls 14 positioned on the surface 12. Generally the solder balls 14 are positioned while heated so that they adhere to the surface 12. In one common application, the solder balls 14 are placed on contacts on a surface 12 to make good electrical connection thereto.

The solder balls 14 may be any adhering conductive material in any desired shape whether it be a spherical shape or otherwise. The solder balls 14 may be literally made of solder or other adhesive conductive materials, including conductive adhesives. The solder balls 14 may be applied as discrete balls, from an integrated preform as an array of solder balls or from paste.

The surface 12 may be any of a variety of surfaces utilized in electronic fabrication that may include surface irregularities including surfaces prone to warping.

Referring to FIG. 1, the surface 12 is shown with a slight upward warp. Because of this warping, solder balls 14 near the center of the surface 12 may be excessively compressed during surface mounting. Solder balls 14 near the edges may fail to reach the surface to be bonded or may be associated with that surface in an ineffective fashion resulting in the failure to make a good electrical connection. Thus, the solder balls 14 may be excessively compressed raising the possibility of shorts or may be ineffectively compressed raising the possibility of opens.

After the solder balls 14 have been attached to the appropriate contacts on the surface 12, the assembly may be subjected to a scraping treatment. A scraper 16 may be a hot knife attached to a squeegee of a screen printer in one embodiment, a milling tool such as a fly cutter, or any other tool that is able to remove the top part of the solder balls 14 without excessive smearing.

In one embodiment, the scraper 16 moves on a pair of spaced rails 18 so as to maintain the scraper blade 20 (FIG. 4) in a level orientation.

Figure 3:
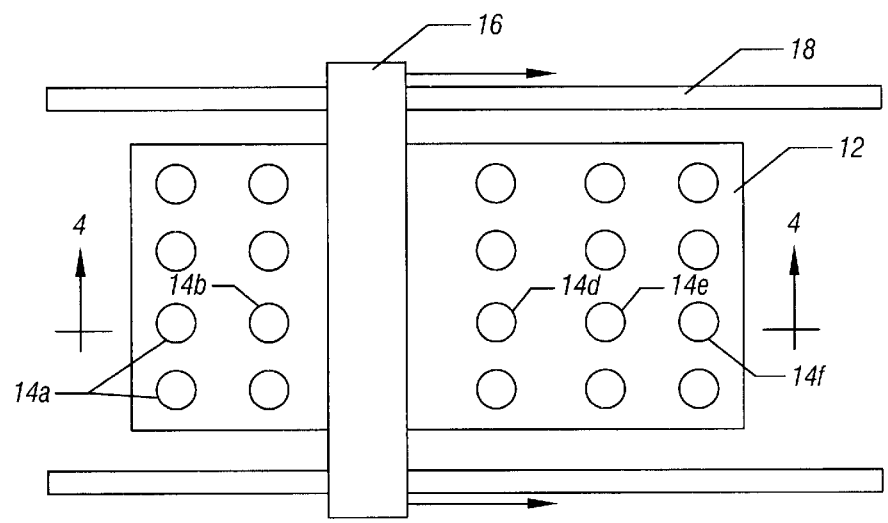
FIG. 3 is a top plan view corresponding to FIG. 2 at a subsequent stage in the fabrication process in accordance with one embodiment of the present invention.
Figure 4:
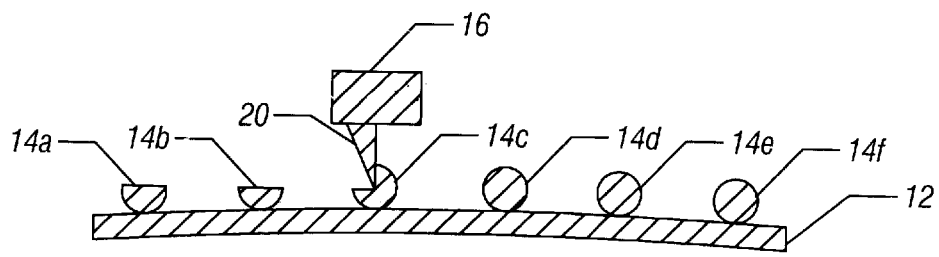
FIG. 4 is a cross-sectional view taken generally along the line 4—4 in FIG. 3.

Referring to FIG. 3, the scraper 16 is moved across the array of solder balls 14 in the direction of the arrows. As it does so, the scraper 16 scrapes off the tops of the solder balls 14 down to a level surface, as suggested in FIG. 4. In FIG. 4, the solder ball 14a is scraped less than the solder ball 14b, because the solder ball 14b has been pushed upwardly by the warping of the surface 12.

The scrapper 16 includes a knife 20 which scrapes off the tops of the solder balls 14. Because it is a heated knife in one embodiment, the knife 20 may easily remove the solder material by softening the material in the course of scraping the solder material.

Figure 5:
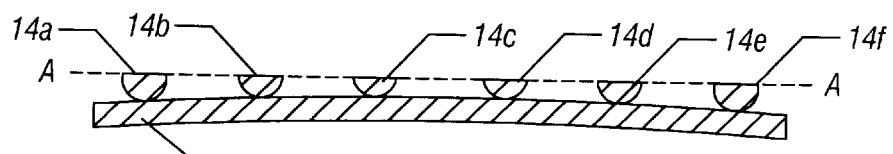
FIG. 5 is a cross-sectional view showing the structure of FIG. 1 after the processing of FIGS. 2, 3 and 4 in accordance with one embodiment of the present invention.

The result of the scraping operation is shown in FIG. 5. There, it can be seen that even though the surface 12 is warped, the scraping operation defines a substantially planar surface, indicated by the dashed line A—A, by scraping off the tops of the solder balls 14. Instead of actually scraping off the material, the solder material may instead be flattened downwardly to a level planar surface, in other embodiments by variably and selectively heating the solder balls 14 or the tops thereof. Thus, the solder balls 14a and 14f, astride the warped area, tend to be thicker while the solder balls 14c and 14d at the apex of the warping tend to be thinner to create the overall planar surface indicated by the dashed line A—A in FIG. 5.

As a result of the planarization of the solder balls 14 in the fashion described above, a substantially planar surface 12 may then be surface mounted onto the surface 12 which is warped. The solder balls 14 accommodate for the non-planarity of the surface 12 and allow the use of a planar surface 10.

Figure 6:
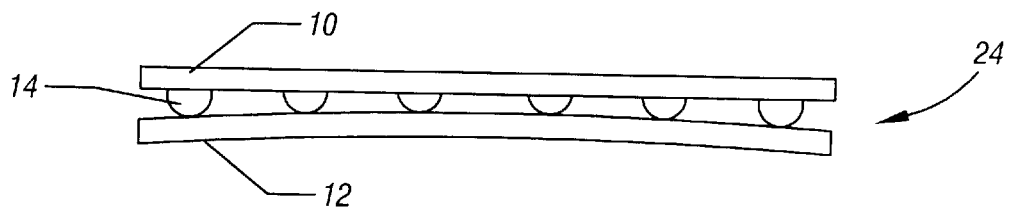
FIG. 6 shows a completed assembly in accordance with one embodiment of the present invention.

As one application of embodiments of the present invention, the surface 10 may be a glass panel which tends to be relatively planar, while the surface 12 may be a ceramic panel such as those used in making displays. In one embodiment, the device 24, shown in FIG. 6, may be a display panel using organic light emitting device (OLED) materials. In such case, the panel forming the surface 10 may allow the emitted light to escape from the display device 24 through the transparent structure of the panel.

The ceramic panel may, in one embodiment, be a ceramic sheet made of allumina material for example. Electrical interconnections may be provided by the surface 12 while the display material may be literally deposited on the surface 10. In this way, a surface, subject to some warping, may be utilized to create a planar structure. Of course, the present invention is not limited to displays and may be utilized in connection with a wide variety of surface mount technologies including those that bond integrated circuits to circuit boards and the like.

In some cases, the minimum height of the solder balls 14 may be determined to enable the adjustable setting of the blade 20. For example, by forming solder balls at 20 mils in height initially and planarizing to a minimum bump height of 5 mils, cambers of up to 20 mils in the surface 12 can be accommodated. The minimum height can be determined by scanning the surface 12 for camber by means of an in line height scanner or other optical or mechanical gauges.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An electronic device comprising:

a first surface; and a second surface, surface mounted to said first surface by solder bumps, said solder bumps having a volume dependent upon the nature of irregularities in said first surface.

2. The device of claim 1 wherein said device is an electronic display.

3. The device of claim 1 wherein said device is an organic light emitting device display.

4. The device of claim 1 wherein said first surface is formed at least in part of ceramic.

5. The device of claim 1 wherein said second surface is formed at least in part of glass.

* * * * *